United States Patent
Liu et al.

(10) Patent No.: US 12,144,204 B2
(45) Date of Patent: Nov. 12, 2024

(54) DISPLAY SUBSTRATE INCLUDING A COMMON BUFFER LAYER

(71) Applicants: Hefei Xinsheng Optoelectronics Technology Co., Ltd., Anhui (CN); BOE Technology Group Co., Ltd., Beijing (CN)

(72) Inventors: Ning Liu, Beijing (CN); Qinghe Wang, Beijing (CN); Liusong Ni, Beijing (CN); Tao Sun, Beijing (CN); Bin Zhou, Beijing (CN); Liangchen Yan, Beijing (CN)

(73) Assignees: HEFEI XINSHENG OPTOELECTRONICS TECHNOLOGY CO., LTD., Anhui (CN); BOE Technology Group Co., Ltd., Beijing (CN)

( * ) Notice: Subject to any disclaimer, the term of this patent is extended or adjusted under 35 U.S.C. 154(b) by 555 days.

(21) Appl. No.: 17/432,217

(22) PCT Filed: Feb. 4, 2021

(86) PCT No.: PCT/CN2021/075319
§ 371 (c)(1),
(2) Date: Aug. 19, 2021

(87) PCT Pub. No.: WO2021/164569
PCT Pub. Date: Aug. 26, 2021

(65) Prior Publication Data
US 2023/0148287 A1    May 11, 2023

(30) Foreign Application Priority Data
Feb. 17, 2020   (CN) .................. 202010097583.X

(51) Int. Cl.
*H10K 59/12*   (2023.01)
*H10K 59/121*  (2023.01)
(Continued)

(52) U.S. Cl.
CPC ..... *H10K 59/1216* (2023.02); *H10K 59/1201* (2023.02); *H10K 59/12* (2023.02);
(Continued)

(58) Field of Classification Search
CPC .......... H10K 59/1216; H10K 59/1213; H10K 59/126; H10K 59/12; H10K 59/122;
(Continued)

(56) References Cited

U.S. PATENT DOCUMENTS

2006/0284254 A1* 12/2006 Liu ................. H01L 27/1255
257/E27.113
2013/0056736 A1* 3/2013 Kim ................. G09G 3/3677
438/34

(Continued)

FOREIGN PATENT DOCUMENTS

| CN | 107785405 A | 3/2018 |
|---|---|---|
| CN | 108122945 A | 6/2018 |

(Continued)

*Primary Examiner* — Ida M Soward
(74) *Attorney, Agent, or Firm* — IPro, PLLC

(57) ABSTRACT

A displaying substrate, a manufacturing method thereof, and a display panel. The displaying substrate includes: a first capacitor electrode at least partially located in luminous zones, a buffer layer covering the first capacitor electrode, and a second capacitor electrode and an active layer that are disposed on the buffer layer and do not overlap with each other, wherein the active layer is located in a non-luminous zone, and the first capacitor electrode, the buffer layer and the second capacitor electrode form a storage capacitor.

19 Claims, 4 Drawing Sheets

(51) Int. Cl.
    *H10K 59/122* (2023.01)
    *H10K 59/124* (2023.01)
    *H10K 59/126* (2023.01)
    *H10K 59/35* (2023.01)

(52) U.S. Cl.
    CPC ......... *H10K 59/122* (2023.02); *H10K 59/124* (2023.02); *H10K 59/126* (2023.02); *H10K 59/352* (2023.02)

(58) Field of Classification Search
    CPC ............... H10K 59/352; H10K 59/124; H01L 27/1255; H01L 29/78633
    See application file for complete search history.

(56) References Cited

U.S. PATENT DOCUMENTS

| | | | |
|---|---|---|---|
| 2014/0367664 A1* | 12/2014 | Park | H10K 59/38 438/34 |
| 2018/0122883 A1 | 5/2018 | Beak et al. | |
| 2018/0182836 A1 | 6/2018 | Beak et al. | |
| 2019/0043938 A1* | 2/2019 | Lee | H10K 59/123 |
| 2020/0075701 A1 | 3/2020 | Song et al. | |
| 2021/0335956 A1 | 10/2021 | Zhang et al. | |

FOREIGN PATENT DOCUMENTS

| | | | | |
|---|---|---|---|---|
| CN | 108242457 A | | 7/2018 | |
| CN | 108428730 A | | 8/2018 | |
| CN | 105280649 B | * | 10/2018 | ........... H01L 23/552 |
| CN | 108735792 A | | 11/2018 | |
| CN | 109256396 A | | 1/2019 | |
| CN | 110047892 A | | 7/2019 | |
| KR | 102009854 B1 | * | 8/2019 | ............. H05B 33/00 |

* cited by examiner luminous zone    non-luminous zone

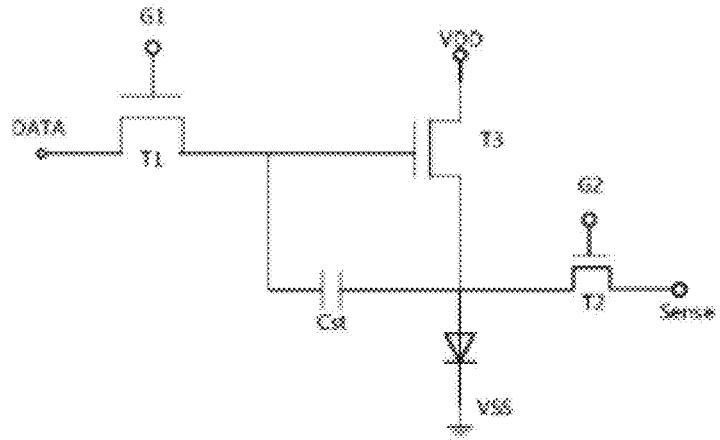

FIG. 3

| Forming a first capacitor electrode, wherein the first capacitor electrode is at least located in luminous zones | S01 |

↓

| Forming a buffer layer, wherein the buffer layer covers the first capacitor electrode and is located in the luminous zones and a non-luminous zone | S02 |

↓

| Forming a second capacitor electrode and an active layer that do not overlap with each other on the buffer layer, wherein the active layer is located in the non-luminous zone | S03 |

↓

| Forming a gate, wherein the gate is disposed on the active layer, is located in the non-luminous zone, and is electrically connected to the second capacitor electrode | S04 |

↓

| Forming an anode, wherein the anode is disposed on the second capacitor electrode and the gate, is at least located in the luminous zones, and is electrically connected to the first capacitor electrode and the active layer | S05 |

FIG. 4

DISPLAY SUBSTRATE INCLUDING A COMMON BUFFER LAYER

The disclosure claims priority to Chinese Patent Application No. 202010097583.X, entitled "DISPLAYING SUBSTRATE, MANUFACTURING METHOD THEREOF, AND DISPLAY PANEL", filed with the China National Intellectual Property Administration on Feb. 17, 2020, which is incorporated herein by reference in its entirety.

TECHNICAL FIELD

The disclosure relates to the technical field of display, in particular to a displaying substrate, a manufacturing method thereof, and a display panel.

BACKGROUND

Top-gate thin film transistors (TFTs) with the characteristic of short channels have an on-state current that is effectively increased, thus being able to remarkably improving the display effect and effectively reducing power consumption. In addition, the overlapping area of the gate with the source and the drain of the top-gate TFTs is small, such that a small parasitic capacitance is generated, and the possibility of short circuits between the gate and the drain is effectively lowered. Because of these remarkable advantages, the top-gate TFTs are gaining more and more attention.

The circuit of top-gate active matrix organic light emitting diode (AMOLED) products typically adopts a 3T1C structure when designed. Specifically, a storage capacitor is formed by an indium tin oxide (ITO) electrode and a Cst electrode. Wherein, the ITO electrode is an ITO anode extending into a non-luminous zone, the Cst electrode is disposed on the same layer as metal layers of the source and drain (SD) of the TFT and is located between a metal electrode of the source and a metal electrode of the drain. To make the storage capacitor large enough to ensure that an emitting layer (EL) has a sufficient emitting time, the facing area of the ITO electrode and the Cst electrode should be large enough.

SUMMARY

The embodiments of the disclosure provide a displaying substrate, a manufacturing method thereof, and a display panel. The displaying substrate provides a storage capacitor design structure.

To fulfill the above objective, the embodiments of the disclosure adopt the following technical solution:

In an aspect, a displaying substrate comprises an active area, wherein the display area comprises multiple luminous zones arranged in an array and a non-luminous zone located between the adjacent luminous zones;
the displaying substrate further comprises:
a first capacitor electrode at least partially located in the luminous zones,
a buffer layer covering the first capacitor electrode and located in the luminous zones and the non-luminous zone; and
a second capacitor electrode and an active layer that are disposed on the buffer layer and do not overlap with each other, wherein the active layer is located in the non-luminous zone;
wherein, the first capacitor electrode, the buffer layer and the second capacitor electrode form a storage capacitor.

Optionally, further comprising:
a gate disposed on and insulated from the active layer, located in the non-luminous zone, and electrically connected to the second capacitor electrode; and
an anode disposed on the second capacitor electrode and the gate, insulated from the second capacitor electrode and the gate, at least partially located in the luminous zones, and electrically connected to the first capacitor electrode and the active layer.

Optionally, the first capacitor electrode is located in the non-luminous zone, the second capacitor electrode is located in the luminous zones, the anode is located in the non-luminous zone, and the active layer is made of a metal oxide;
the displaying substrate further comprises:
an interlayer dielectric layer disposed between the second capacitor electrode and the anode, located in the luminous zones and the non-luminous zone, and covering the second capacitor electrode, the gate and the active layer.

Optionally, further comprising:
a first connecting electrode and a second connecting electrode that are disposed between the interlayer dielectric layer and the anode and do not overlap with each other, wherein the first capacitor electrode, the active layer and the anode are electrically connected by the first connecting electrode, and the second capacitor electrode and the gate are electrically connected by the second connecting electrode.

Optionally, the first connecting electrode is at least partially located in the non-luminous zone;
the displaying substrate further comprises:
an insulating layer disposed between the anode and the interlayer dielectric layer, located in the luminous zones and the non-luminous zone, and at least covering the interlayer dielectric layer, the first connecting electrode and the second connecting electrode.

Optionally, further comprising:
a first via hole penetrating through the interlayer dielectric layer and the buffer layer, wherein the first connecting electrode is electrically connected to the first capacitor electrode by the first via hole,
a second via hole penetrating through the interlayer dielectric layer, wherein the first connecting electrode is electrically connected to the active layer by the second via hole; and
a third via hole penetrating through the insulating layer, wherein the first connecting electrode is electrically connected to the anode by the third via hole.

Optionally, a thickness of a portion, forming the storage capacitor, of the buffer layer is less than a thickness of a portion, covering the storage capacitor, of the interlayer dielectric layer.

Optionally, the second connecting electrode is located in the luminous zones and the non-luminous zone;
the displaying substrate further comprises:
a fourth via hole penetrating through the interlayer dielectric layer, wherein the second connecting electrode is electrically connected to the gate by the fourth via hole; and
a fifth via hole penetrating through the interlayer dielectric layer, wherein the second connecting electrode is electrically connected to the second capacitor electrode by the fifth via hole.

Optionally, the fourth via hole is formed above a side, close to the second connecting electrode, of the gate, and the fifth via hole is formed above a side, close to the second connecting electrode, of the second capacitor electrode.

Optionally, further comprising:
a source and a drain disposed between the interlayer dielectric layer and the anode, wherein the source, the drain, the first connecting electrode and the second connecting electrode are disposed on a same layer and do not overlap with each other, and the source and the drain are located in the non-luminous zone and are electrically connected to the active layer.

Optionally, the first capacitor electrode is located in the non-luminous zone;
the displaying substrate further comprises:
a substrate; and
a light-shield layer disposed between the substrate and the first capacitor electrode and located in the non-luminous zone, wherein a projection of the active layer on the substrate is located within a projection of the light-shield layer on the substrate, and the first capacitor electrode covers the light-shield layer.

In another aspect, a display panel is provided, comprising the above displaying substrate.

In another aspect, a manufacturing method of the above displaying substrate is provided, the displaying substrate comprising an active layer, the active layer comprising a plurality of luminous zones arranged in an array and a non-luminous zone located between the adjacent luminous zones;
the method comprising:
forming the first capacitor electrode, wherein the first capacitor electrode is at least partially located in the luminous zones;
forming the buffer layer, wherein the buffer layer covers the first capacitor electrode and is located in the luminous zones and the non-luminous zone; and
forming the second capacitor electrode and the active layer that do not overlap with each other on the buffer layer, wherein the active layer is located in the non-luminous zone;
wherein, the first capacitor electrode, the buffer layer and the second capacitor electrode form the storage capacitor.

Optionally, further comprising:
forming a gate, wherein the gate is disposed on the active layer, located in the non-luminous zone, and is electrically connected to the second capacitor electrode; and
forming an anode, wherein the anode is disposed on the second capacitor electrode and the gate, at least partially located in the luminous zones, and electrically connected to the first capacitor electrode and the active layer.

Optionally, the second capacitor electrode is located in the luminous zones, and the active layer is made of a metal oxide,
forming a second capacitor electrode and an active layer that do not overlap with each other on the buffer layer comprises:
forming the second capacitor electrode to be subjected to conductor transformation and an active layer to be subjected to conductor transformation, that do not overlap with each other, on the buffer layer by a one-step patterning process, wherein the active layer to be subjected to conductor transformation comprises a semiconductor portion, and portions to be subjected to conductor transformation located on two sides of the semiconductor portion and connected to the semiconductor portion; and
performing conductor transformation on the second capacitor electrode to be subjected to conductor transformation and the portions to be subjected to conductor transformation to form the second capacitor electrode and the active layer.

Optionally, the displaying substrate further comprises a gate insulating layer located between the active layer and the gate,
before the step of forming the gate, the method further comprises:
forming the gate insulating layer, wherein the gate insulating layer is located on the active layer;
forming the gate insulating layer comprises:
forming a gate insulating film.

Optionally, forming the gate comprises: forming a gate metal film on the gate insulating film,
coating the gate metal film with a photoresist; and
exposing, developing and etching the gate insulating film and the gate metal film with a same mask to form the gate insulating layer and the gate.

Optionally, after the step of exposing, developing and etching the gate insulating film and the gate metal film with a same mask, the step of performing conductor transformation on the second capacitor electrode to be subjected to conductor transformation and the portions to be subjected to conductor transformation to is executed;
forming the gate further comprises:
stripping the photoresist on the gate after performing conductor transformation on the second capacitor electrode to be subjected to conductor transformation and the portions to be subjected to conductor transformation.

Optionally, the anode is located in the non-luminous zone, and the displaying substrate further comprises: a first connecting electrode, a second connecting electrode, a source and a drain that are located between the second capacitor electrode and the anode and do not overlap with each other;
after the step of forming the gate and before the step of forming the anode, the method further comprises:
forming the first connecting electrode, the second connecting electrode, the source and the drain that do not overlap with each other by a one-step patterning process.

Optionally, the displaying substrate further comprises: an interlayer dielectric layer located between the second capacitor electrode and the anode;
after the step of forming the gate and before the step of forming the first connecting electrode and the second connecting electrode, the method further comprises:
forming the interlayer dielectric layer, wherein the interlayer dielectric layer is located in the luminous zones and the non-luminous zone and covers the second capacitor electrode, the gate and the active layer, and
forming a first via hole penetrating through the interlayer dielectric layer and the buffer layer, as well as a second via hole, a fourth via hole and a fifth via hole penetrating through the interlayer dielectric layer;
wherein, the first connecting electrode is electrically connected to the first capacitor electrode by the first via hole and is electrically connected to the active layer by the second via hole, and the second connecting electrode is electrically connected to the gate by the fourth via hole and is electrically connected to the second capacitor electrode by the fifth via hole.

Optionally, the display substrate further comprises an insulating layer located between the anode and the interlayer dielectric layer;

after the step of forming the first connecting electrode and the second connecting electrode and before the step of forming the anode, the method further comprises:

forming the insulating layer, wherein the insulating layer is located in the luminous zones and the non-luminous zone and at least covers the interlayer dielectric layer, the first connecting electrode and the second connecting electrode; and forming a third via hole penetrating through the insulating layer.

Optionally, forming the anode comprises:

forming the anode on a first insulating layer, wherein the anode is electrically connected to the first connecting electrode by the third via hole.

The aforesaid description is merely a brief summary of the technical solution of the disclosure. To allow those skilled in the art to gain a better understanding of the technical means of the disclosure so as to implement the disclosure according to the contents in the specification and to make the above and other purposes, features and advantages of the disclosure clearer, specific implementations of the disclosure are given below.

BRIEF DESCRIPTION OF THE DRAWINGS

To more clearly explain the technical solutions of the embodiments of the disclosure or related arts, drawings used for describing the embodiments of the disclosure or the related arts will be briefly introduced below. Obviously, the drawings in the following description only illustrate some embodiments of the disclosure, and those ordinarily skilled in the art can obtain other drawings according to the following ones without creative labor.

FIG. 3 is a schematic diagram of a 3T1C circuit according to one embodiment of the disclosure;

FIG. 4 is a flow diagram of a manufacturing method of a displaying substrate according to one embodiment of the disclosure;

DETAILED DESCRIPTION

The technical solutions of the embodiments of the disclosure will be clearly and completely described below in conjunction with the drawings of the embodiments of the disclosure. Obviously, the embodiments in the following description are merely illustrative ones, and are not all possible ones of the disclosure. All other embodiments obtained by those ordinarily skilled in the art based on the following ones without creative labor should also fall within the protection scope of the disclosure.

In the embodiments of the disclosure, terms such as "first" and "second" are used to distinguish identical or similar elements with basically the same function and effect merely for the purposes of clearly describing the technical solutions of the embodiments of the disclosure, and should not be construed as indicating or implying relative importance or implicitly indicating the number of technical features referred to.

Figure 1:
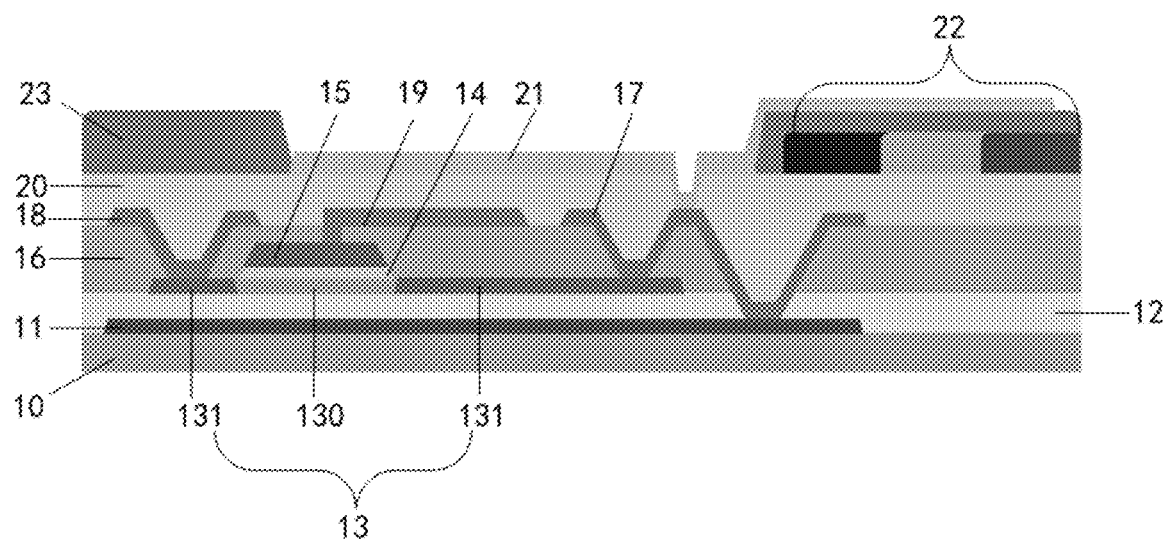
FIG. 1 is a structural diagram of a displaying substrate in related arts.

In related arts, as shown in FIG. 1, a top-gate AMOLED array substrate comprises a substrate 10, a light shield 11, a buffer layer 12, an indium gallium zinc oxide (IGZO) active layer 13, a gate insulating layer 14, a gate 15 and an interlayer dielectric layer 16 sequentially disposed on the substrate 10, an source (S) 17 and a drain (D) 18 disposed on the interlayer dielectric layer 16, a Cst electrode 19 disposed between the source 17 and the drain 18, an insulating layer (PVX layer) 20 covering the source 17, the drain 18 and the Cst electrode 19, and an ITO electrode 21 disposed on the PVX layer 20. Wherein, the Cst electrode and the ITO electrode are two electrodes of a storage capacitor, and the PVX layer is an insulating dielectric between the two electrodes. The Cst electrode is located between the source and the drain. To improve the capacitance of the storage capacitor, the facing area of the ITO electrode and the Cst electrode should be very large, which will inevitably enlarge the area occupied by the TFT, that is, the area of a non-luminous zone is increased, and the area of a luminous zone is decreased, thus greatly decreasing the aperture ratio and compromising the display quality. In FIG. 1, the active layer 13 comprises a semiconductor portion 130 and conductor portions 131 located on two sides of the semiconductor portion 130. Of course, the array substrate further comprises a color filter 22, a resin layer 23, and other film layers, which will no longer be detailed here.

Figure 8:
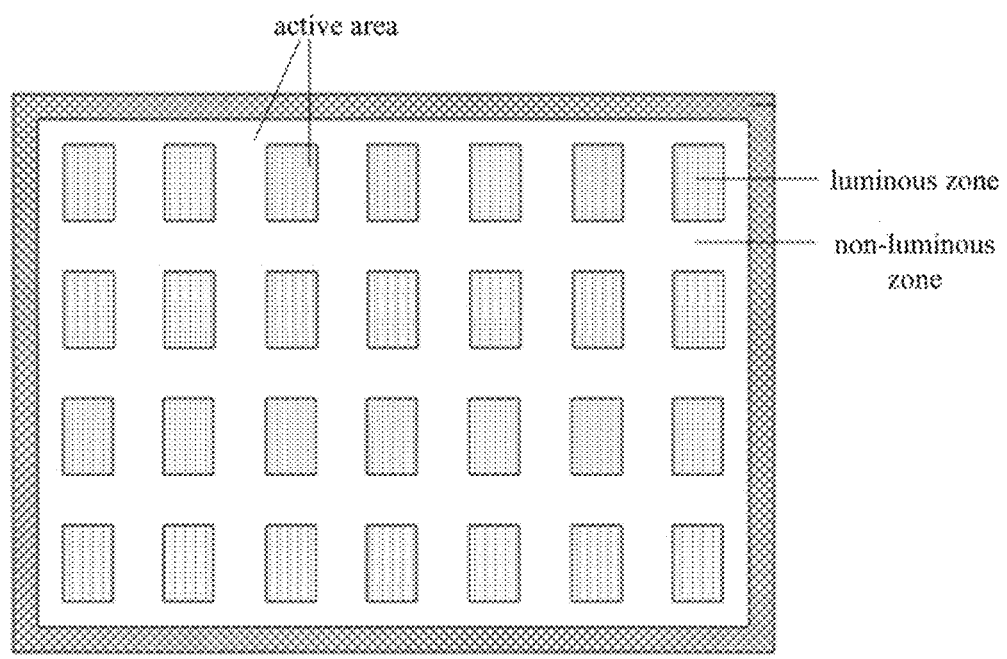
FIG. 8 is a schematic diagram showing an active area, luminous zones and a non-luminous zone according to one embodiment of the disclosure.

One embodiment of the disclosure provides a displaying substrate. As shown in FIG. 8, the displaying substrate comprises an active area, wherein the active layer comprises multiple luminous zones arranged in an array and a non-luminous zone located between the adjacent luminous zones.

Figure 2:
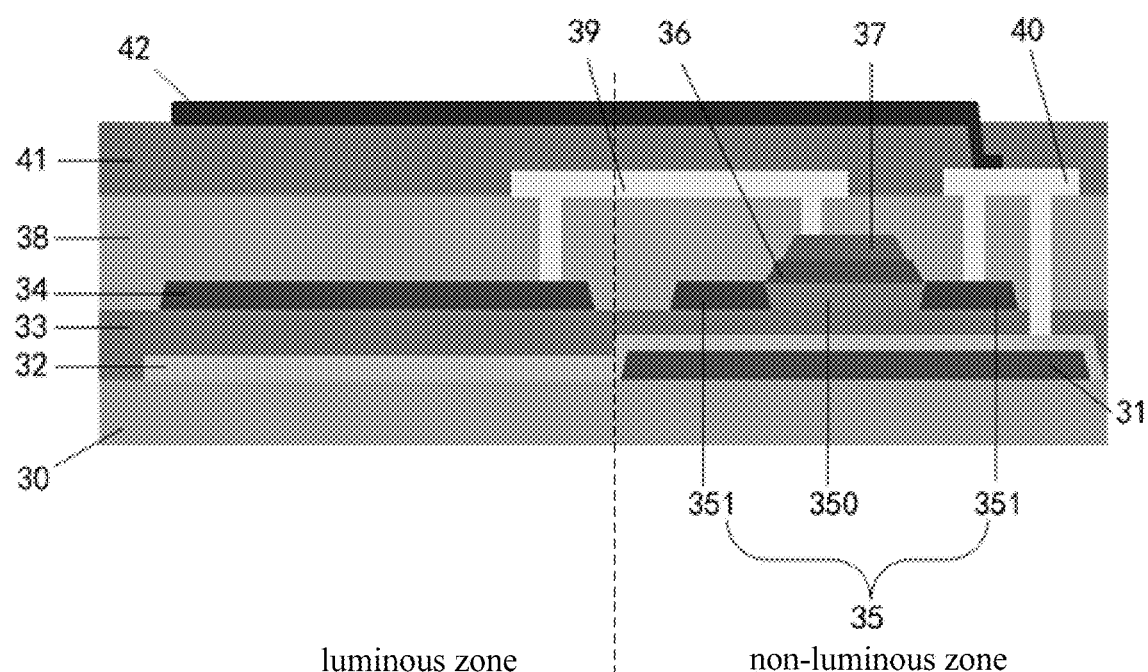
FIG. 2 is a structural diagram of a displaying substrate according to one embodiment of the disclosure.

As shown in FIG. 2, the displaying substrate further comprises:

A first capacitor electrode 32 at least partially located in the luminous zones;

A buffer layer 33 covering the first capacitor electrode 32 and located in the luminous zones and the non-luminous zone; and A second capacitor electrode 34 and an active layer 35 that are disposed on the buffer layer 33 and do not overlap with each other, wherein the active layer 35 is located in the non-luminous zone.

Wherein, the first capacitor electrode 32, the buffer layer 33 and the second capacitor electrode 34 form a storage capacitor.

The displaying substrate (also referred to as array substrate) is mainly applied to self-luminous organic light emitting diode (OLED) display panels such as top-emission OLED display panels or bottom-emission OLED display panels, and the disclosure has no limitation in this aspect. If the displaying substrate is applied to the bottom-emission OLED display panels, the first capacitor electrode, the buffer layer and the second capacitor electrode are all made of light-transmitting materials. If the displaying substrate is applied to the top-emission OLED display panels, the disclosure has no requirement for the light transmittance of the first capacitor electrode, the buffer layer and the second capacitor electrode.

The active area (AA) of the displaying substrate refers to an area for realizing display, and the luminous zones (also referred to as pixel aperture zones) refer to zones provided with OLED units. According to the related arts, the OLED unit comprises an anode, an organic light-emitting functional layer and a cathode. The non-luminous zone refer to a zone, except for the luminous zones, in the active area, and a pixel defining layer and a pixel circuit unit may be disposed in the non-luminous zone. The pixel circuit unit may comprise thin film transistors (TFTs), grid lines, data lines, and the like.

The first capacitor electrode may be made of a metal or metal oxide (such as ITO) Because of the good light transmittance of ITO, the first capacitor electrode made of ITO may be applied to bottom-emission OLED display panels. The buffer layer may be made of an insulating oxide, nitride, or oxynitride, and the disclosure has no limitation in this aspect. The material of the second capacitor electrode is not limited either, and specifically depends on actual circumstances.

The buffer layer may comprise one or more insulating layers, which depends on a specific process and is not limited here. In the embodiments and drawings of the disclosure, the buffer layer comprises one insulating layer by way of example.

The second capacitor electrode may be entirely located in the luminous zones; or, part of the second capacitor electrode is located in the luminous zones, and the other part of the second capacitor electrode is located in the non-luminous zone, that is, portions, located in the luminous zones, of the second capacitor electrode may extend into the non-luminous zone. The disclosure has no limitation in this aspect, and the specific configuration depends on actual circumstances. In the embodiments and drawings of the disclosure, the second capacitor electrode is entirely located in the luminous zones by way of example.

The second capacitor electrode and the active layer may be formed by a one-step patterning process (that is, the second capacitor electrode and the active layer are disposed on the same layer) or by other processes (such as printing), and the disclosure has no limitation in this aspect. To reduce the manufacturing cost, the former is preferred, and in this case, the second capacitor electrode and the active layer are made of the same material. In the embodiments and drawings of the disclosure, the former is adopted by way of example. The second capacitor electrode and the active layer do not overlap with each other, that is to say, an orthographic projection of the second capacitor electrode on a substrate of the displaying substrate does not overlap with an orthographic projection of the active layer on the substrate of the displaying substrate.

The material of the active layer is not limited here, and may be a metal oxide semiconductor such as IGZO, ZnO or ZnON, wherein IGZO has good performance, thus being applied more widely. The material of the active layer may also be monocrystalline silicon, polysilicon, or the like, which is not limited here and specifically depends on actual requirements. In the embodiments and drawings of the disclosure, the material of the active layer is a metal oxide by way of example. The active layer made of the metal oxide typically comprises a semiconductor portion and conductor portions located on two sides of the semiconductor portion and connected to the semiconductor portion. In FIG. 2, the active layer 35 comprises a semiconductor portion 350 (also referred to Act portion), a conductor portion 351 (also referred to conductor Act portion) located on a left side of the semiconductor portion 350, and a conductor portion 351 (also referred to conductor Act portion) located on a right side of the semiconductor portion 350, and in this case, the second capacitor electrode is made of a conductive metal oxide.

Optionally, the displaying substrate further comprises:

A gate 37 disposed on and isolated from the active layer 35, located in the non-luminous zone, and electrically connected to the second capacitor electrode 34; and An anode 42 disposed on the second capacitor electrode 34 and the gate 37, insulated from the second capacitor electrode 34 and the gate 37, at least partially located in the luminous zones, and electrically connected to the first capacitor electrode 32 and the active layer 35.

The material of the gate is not limited, and may be a metal or metal oxide, such as Cu, Al, Ag, Mo, Cr, Nd, Ni, Mn, Ti, Ta and W, and an alloy thereof. The material of the anode is not limited either, and is generally ITO.

In the displaying substrate, the first capacitor electrode and the second capacitor electrode are used as two electrodes of the storage capacitor respectively, the buffer layer is used as an insulating dielectric between the two electrodes, and the first capacitor electrode, the second capacitor electrode and the buffer layer form the storage capacitor jointly. The second capacitor electrode does not overlap with the active layer, and compared with related arts, the second capacitor electrode is located in the luminous zones and is disposed outside a TFT, such that the area occupied by the TFT is reduced, the area of the non-luminous zone is decreased, and the aperture ratio is increased, accordingly.

In addition, the facing area of the second capacitor electrode and the first capacitor electrode is in direct proportion to the capacitance of the storage capacitor, so the capacitance of the storage capacitor may be increased by enlarging the facing area of the second capacitor electrode and the first capacitor electrode, specifically by enlarging the area of the second capacitor electrode in the luminous zones. That is, the capacitance of the storage capacitor may be increased without enlarging the area of the non-luminous zone, such that the aperture ratio is further increased.

To sum up, the displaying substrate provides a storage capacitor design structure that is able to minimize the area occupied by the TFT under the precondition that a storage capacitor is large enough, such that the area of non-luminous zone is decreased, thus remarkably increasing the aperture ratio and greatly improving the display quality of products.

Optionally, the first capacitor electrode is located in the non-luminous zone, the second capacitor electrode is located in the luminous zones, the anode is located in the non-luminous zone, and the material of the active layer is a metal oxide such as IGZO, ZnO, or ZnON.

As shown in FIG. 2, the displaying substrate further comprises:

An interlayer dielectric layer 38 disposed between the second capacitor electrode 34 and the anode 42, located in the luminous zones and the non-luminous zone, and covering the second capacitor electrode 34, the gate 37 and the active layer 35; and A first connecting electrode 40 and a second connecting electrode 39 that are disposed between the interlayer dielectric layer 38 and the anode 42 and do not overlap with each other, wherein the first capacitor electrode 32, the active layer 35 and the anode 42 are electrically connected by means of the first connecting electrode 40, and the second capacitor electrode 34 and the gate 37 are electrically connected by means of the second connecting electrode 39.

The interlayer dielectric layer (ILD layer) is an organic insulating layer and is able to insulate and protect the grate and the active layer, and the material of the interlayer dielectric layer is not limited, and may be an oxide, nitride, oxynitride, or the like.

The first connecting electrode and the second connecting electrode do not overlap with each other, that is to say, an orthographic projection of the first connecting electrode on the substrate of the displaying substrate does not overlap with an orthographic projection of the second connecting electrode on the substrate of the displaying substrate. The shape, material and positional distribution of the first connecting electrode and the second connecting electrode are not limited here.

According to the displaying substrate, the first capacitor electrode, the active layer and the anode are electrically connected by means of the first connecting electrode, and the second capacitor electrode and the gate are electrically connected by means of the second connecting electrode, such that the structure is simple and easy to implement.

Optionally, as shown in FIG. 2, the first connecting electrode is at least partially located in the non-luminous zone, and the displaying substrate further comprises:

An insulating layer (PVX) 41 disposed between the anode 42 and the interlayer dielectric layer 38, located in the luminous zones and the non-luminous zone, and at least covering the interlayer dielectric layer 38, the first connecting electrode 40 and the second connecting electrode 39;

A first via hole (CNT via hole, not marked in FIG. 2) penetrating through the interlayer dielectric layer 38 and the buffer layer 33, wherein the first connecting electrode 40 is electrically connected to the first capacitor electrode 32 by means of the first via hole;

A second via hole (not marked in FIG. 2) penetrating through the interlayer dielectric layer 38, wherein the first connecting electrode is electrically connected to the active layer 35 by means of the second via hole; and A third via hole (PVX via hole, not marked in FIG. 2) penetrating through the insulating layer, wherein the first connecting electrode is electrically connected to the anode by means of the third via hole.

The second via hole merely penetrates through the interlayer dielectric layer and is an ILD via hole.

The first connecting electrode is at least partially located in the non-luminous zone, that is to say, the first connecting electrode is entirely located in the non-luminous zone; or, one part of the first connecting electrode is located in the non-luminous zone, and the other part of the first connecting electrode is located in the luminous zones, that is, a portion, located in the non-luminous zone, of the first connecting electrode may extend into the luminous zones. The disclosure has no limitation in this aspect, and the specific configuration depends on actual circumstances. In the embodiments and drawings of the disclosure, the first connecting electrode is entirely located in the non-luminous zone by way of example.

The specific positions of the first via hole, the second via hole and the third via hole are not limited here. If the first connecting electrode is located in the non-luminous zone, the first via hole, the second via hole and the third via hole are formed in the non-luminous zone, as shown in FIG. 2, by way of example for the purpose of simplifying the structure; and in this case, the first connecting electrode directly contacts with a portion, located in the non-luminous zone, of the first capacitor electrode by means of the first via hole, such that the first connecting electrode and the first capacitor electrode are electrically connected; the first connecting electrode directly contacts with the conductor portion (located on the right side of the semiconductor portion) of the active layer by means of the second via hole, such that the first connecting electrode and the active layer are electrically connected, and the first connecting electrode directly contacts with a portion, located in the non-luminous zone, of the anode by means of the third via hole, such that the first connecting electrode and the anode are electrically connected. It should be noted that the active layer is made of a metal oxide in FIG. 2 by way of example.

It should be noted that if the first connecting electrode, the second connecting electrode, and a source and a drain of a TFT are disposed on the same layer and do not overlap with each other, the insulating layer also covers the source and the drain.

According to the displaying substrate, the first connecting electrode is electrically connected to the first capacitor electrode by means of the first via hole, is electrically connected to the active layer by means of the second via hole, and is electrically connected to the anode by means of the third via hole, such that the first capacitor electrode, the active layer and the anode are electrically connected. This structural design is simple and easy to implement.

Optionally, the thickness of a portion, forming the storage capacitor, of the buffer layer is less than that of a portion, covering the storage capacitor, of the interlayer dielectric layer. The buffer layer is located between the first capacitor electrode and the second capacitor electrode and has a small influence on the yield, so the thickness of the buffer layer may be very small. The capacitance of the storage capacitor is in negative correlation with the distance between the two electrodes (namely, the thickness of the portion, forming the storage capacitor, of the buffer layer), so the thickness of the portion, forming the storage capacitor, of the buffer layer may be decreased to remarkably improve the storage capacity of the capacitor, so as to further improve the display effect. To reduce the number of times of patterning, the gate and a gate line are disposed on the same layer, a date line, the source and the drain are disposed on the same layer, and the interlayer dielectric layer is located between these two layers. To prevent short circuits between the gate line and the data line, the interlayer dielectric layer needs to be thick enough.

Optionally, as shown in FIG. 2, the second connecting electrode is located in the luminous zones and the non-luminous zone, and the displaying substrate further comprises:

A fourth via hole (not marked in FIG. 2) penetrating through the interlayer dielectric layer 38, wherein the second connecting electrode 39 is electrically connected to the gate 37 by means of the fourth via hole; and A fifth via hole (not marked in FIG. 2) penetrating through the interlayer dielectric layer 38, wherein the second connecting electrode 39 is electrically connected to the second capacitor electrode 34 by means of the fifth via hole.

The fourth via hole and the fifth via hole merely penetrate through the interlayer dielectric layer and are both ILD via holes. The specific positions of the fourth via hole and the fifth via hole are not limited here. To reduce the area occupied by the second connecting electrode to save space and costs, the fourth via hole is formed above a side, close to the second connecting electrode, of the gate, and the fifth via hole is formed above a side, close to the second connecting electrode, of the second capacitor electrode, in FIG. 2.

According to the displaying substrate, the second connecting electrode is electrically connected to the gate by means of the fourth hole and is electrically connected to the second capacitor electrode by means of the fifth via hole, such that the second connecting electrode and the gate are electrically connected. This structural design is simple and easy to implement.

Optionally, the displaying substrate further comprises:

A source and a drain disposed between the interlayer dielectric layer and the anode, wherein the source, the drain, the first connecting electrode and the second connecting electrode are disposed on the same layer and do not overlap with each other, and the source and the drain are located in the non-luminous zone and are electrically connected to the active layer.

The electrical connection manner of the source, the drain and the active layer is not limited here. If the active layer is a metal oxide active layer, the source and the drain may be electrically connected to the corresponding conductor portions of the active layer by means of the via holes penetrating through the interlayer dielectric layer, respectively; in this case, the gate, the source, the drain and the active layer form a top-gate metal oxide TFT. Of course, other types of TFTs may be formed by different active layers, which will no longer be detailed here. The configuration that the source, the drain, the first connecting electrode and the second connecting electrode are disposed on the same layer is realized by forming the source, the drain, the first connecting electrode and the second connecting electrode by a one-step patterning process.

The source, the drain, the first connecting electrode and the second connecting electrode do not overlap with each other, that is to say, orthographic projections of the source, the drain, the first connecting electrode and the second connecting electrode on the substrate of the displaying substrate do not overlap with each other.

It should be noted that the circuit of the displaying substrate adopts a 3T1C structure which, as shown in FIG. 3, comprises three TFTs, wherein T1 is a switch TFT, T2 is a compensation TFT, T3 is a drive TFT, Cst is the storage capacitor, the first capacitor electrode and the second capacitor electrode are two electrodes of the storage capacitor, the buffer layer is used as an insulating dielectric between the two electrodes, and the TFT mentioned above may be used as the drive TFT T3.

Optionally, as shown in FIG. 2, the first capacitor electrode is located in the non-luminous zone, and the displaying substrate further comprises:

A substrate 30 and a light shield 31 disposed between the substrate 30 and the first capacitor electrode 32, wherein the light shield 31 is located in the non-luminous zone, a projection of the active layer 35 on the substrate 30 is located within a projection of the light shield 31 on the substrate 30, and the first capacitor electrode 32 covers the light shield 31.

When the displaying substrate is applied to bottom-emission OLED display panels, the light shield is able to prevent external light from being radiated onto the active layer, such that the active layer is protected, and the life of the TFTs is prolonged accordingly. In addition, the light shield is disposed between the substrate and the first capacitor electrode and is protected by the portion, located in the non-luminous zone, of the first capacitor electrode, such that the light shield is prevented from being damaged in the subsequent etching process, and the process applicability is greatly improved.

One embodiment of the disclosure provides a display panel, comprising the displaying substrate in the above embodiment. The display panel has a high aperture ratio, a good display effect and a high quality. The display panel may be a displaying device such as an OLED display, or any products or components comprising the displaying device and having a display function, such as televisions, digital cameras, mobile phones, and tablet personal computers.

One embodiment of the disclosure provides a manufacturing method of the displaying substrate in the above embodiment. The displaying substrate comprises an active area, wherein the active area comprises multiple luminous zones and a non-luminous zone located between the adjacent luminous zones.

As shown in FIG. 4, the method comprises.

S01: forming a first capacitor electrode, wherein the first capacitor electrode is at least partially located in the luminous zones.

For example, the first capacitor electrode may be formed a substrate by a patterning process. The first capacitor electrode may be made of a metal or metal oxide (such as ITO)

S02: forming a buffer layer, wherein the buffer layer covers the first capacitor electrode and is located in the luminous zones and the non-luminous zone.

The buffer layer may be made of an insulating oxide, nitride or oxynitride, and this embodiment has no limitation in this aspect.

S03: forming a second capacitor electrode and an active layer that do not overlap with each other on the buffer layer, wherein the second capacitor electrode is located in the luminous zones, and the active layer is located in the non-luminous zone.

To reduce the manufacturing cost, the second capacitor electrode and the active layer may be formed on the buffer layer by a one-step patterning process. The second capacitance and the active layer may also be manufactured by other methods (such as printing), and this embodiment has no limitation in this aspect.

Wherein, the first capacitor electrode, the buffer layer and the second capacitor electrode form a storage capacitor.

Optionally, the method further comprises:

S04: forming a gate, wherein the gate is disposed on the active layer, is located in the non-luminous zone, and is electrically connected to the second capacitor electrode.

The gate may be made of a metal or metal alloy, such as Cu, Al, Ag, Mo, Cr, Nd, Ni, Mn, Ti, Ta and W, and an alloy thereof.

S05: forming an anode, wherein the anode is disposed on the second capacitor electrode and the gate, is at least partially located in the luminous zones, and is electrically connected to the first capacitor electrode and the active layer.

According to the displaying substrate manufactured by the method, the first capacitor electrode and the second capacitor electrode are used as two electrodes of the storage capacitor respectively, the buffer layer is used as an insulating dielectric between the two electrodes, and the first capacitor electrode, the second capacitor electrode and the buffer layer form the storage capacitor. The second capacitor electrode and the active layer do not overlap with each other, and compared with related arts, the second capacitor electrode is located in the luminous zones and is disposed outside a TFT, such that the area occupied by the TFT is reduced, the area of the non-luminous zone is reduced, and the aperture ratio is increased accordingly.

The displaying substrate formed by the manufacturing method of a displaying substrate in this embodiment of the disclosure provides a storage capacitor design structure that is able to minimize the area occupied by the TFT under the precondition that the storage capacitor is large enough, thus remarkably increasing the aperture ratio and greatly improving the display quality of products. The manufacturing method is simple and easy to implement.

Optionally, the active layer is made of a metal oxide such as IGZO, ZnO or ZnON, and in this case, S03: forming a second capacitor electrode and an active layer that do not overlap with each other on the buffer layer comprises:

S301: forming a second capacitor electrode to be subjected to conductor transformation and an active layer to be subjected to conductor transformation, that do not overlap with each other, on the buffer layer by a one-step patterning process, wherein the active layer to be subjected to conductor transformation comprises a semiconductor portion, and portions to be subjected to conductor transformation located on two sides of the semiconductor portion and connected to the semiconductor portion; and S302: performing conductor transformation on the second capacitor electrode to be subjected to conductor transformation and the portions to be subjected to conductor transformation to form the second capacitor electrode and the active layer, wherein the conductor transformation is implemented by bombarding the portions to be subjected to conductor transformation with H and He particles.

Optionally, the displaying substrate further comprises: a gate insulating layer located between the active layer and the gate, and before S04: forming a gate, the method further comprises:

S06: forming the gate insulating layer located on the active layer.

S06: forming the gate insulating layer comprises: forming a gate insulating film.

For example, the gate insulating film may be deposited on the active layer by a plasma enhanced vapor deposition (PECVD) method, wherein the gate insulating film may be made of an oxide, a nitride, or an oxynitride.

S04: forming a gate comprises:

S401: forming a gate metal film on the gate insulating film;

S402: coating the gate metal film with a photoresist; and

S403: exposing, developing and etching the gate insulating film and the gate metal film with the same mask to form the gate insulating layer and the gate.

By manufacturing the gate insulating layer and the gate through this method, one mask can be saved, the number of times of patterning is reduced, and thus, the cost is reduced, and the production time is shortened. It should be noted that the gate insulating layer and the gate may be etched by a self-alignment process when manufactured, so as to improve the manufacturing accuracy.

Optionally, after S403: exposing, developing and etching the gate insulating film and the gate metal film with the same mask, S302: performing conductor transformation on the second capacitor electrode to be subjected to conductor transformation and the portions to be subjected to conductor transformation is performed. In this way, the semiconductor portion of the active layer will not be affected during the conductor transformation under the protection of the gate insulating layer and the gate.

S04: forming a gate further comprises:

S404: stripping the photoresist on the gate after S302: performing conductor transformation on the second capacitor electrode to be subjected to conductor transformation and the portions to be subjected to conductor transformation. In this way, the gate will not be affected during the conductor transformation under the protection of the photoresist.

Optionally, the anode is located in the non-luminous zone, and the displaying substrate further comprises: a first connecting electrode, a second connecting electrode, a drain and a source that are disposed between the second capacitor electrode and the anode and do not overlap with each other.

After S04: forming a gate and before S05: forming an anode, the method further comprises:

S07: forming the first connecting electrode, the second connecting electrode, the source and the drain that do not overlap with each other by a one-step patterning process, such that the number of times of patterning is reduced, and the cost is reduced.

Optionally, the displaying substrate further comprises: an interlayer dielectric layer located between the second capacitor electrode and the anode.

After S04: forming a gate and before S07: forming the first connecting electrode and the second connecting electrode, the method further comprises:

S08: forming the interlayer dielectric layer, wherein the interlayer dielectric layer is located in the luminous zones and the non-luminous zone and covers the second capacitor electrode, the gate and the active layer. The material of the interlayer dielectric layer is not limited here, and may be an oxide, a nitride, or an oxynitride.

S09: forming a first via hole penetrating through the interlayer dielectric layer and the buffer layer, as well as a second via hole, a fourth via hole and a fifth via hole penetrating through the interlayer dielectric layer.

Wherein, the first connecting electrode is electrically connected to the first capacitor electrode by means of the first via hole and is electrically connected to the active layer by means of the second via hole, and the second connecting electrode is electrically connected to the gate by means of the fourth via hole and is electrically connected to the second capacitor electrode by means of the fifth via hole.

According to the displaying substrate formed by the manufacturing method, the first capacitor electrode and the active layer are electrically connected, and the second capacitor electrode and the gate are electrically connected. The manufacturing method is simple and easy to implement.

Optionally, the displaying substrate further comprises: an insulating layer located between the anode and the interlayer dielectric layer.

After S07: forming the first connecting electrode and the second connecting electrode and before S05: forming an anode, the method further comprises.

S10: forming the insulating layer, wherein the insulating layer is located in the luminous zones and the non-luminous zone and at least covers the interlayer dielectric layer, the first connecting electrode and the second connecting electrode. It should be noted that the source, the drain, the first connecting electrode and the second connecting electrode are disposed on the same layer, and the insulating layer also covers the source and the drain.

S11: forming a third via hole penetrating through the insulating layer.

S05: forming an anode comprises:

Forming the anode on a first insulating layer, wherein the anode is connected to the first connecting electrode by means of the third via hole.

According to the displaying substrate formed by the manufacturing method, the anode is connected to the first connecting electrode, such that the first capacitor electrode, the active layer and the anode are electrically connected. The manufacturing method is simple and easy to implement.

With the structure of the displaying substrate shown in FIG. 2 as an example, the manufacturing method is specifically described below. In FIG. 2, the active layer of the displaying substrate is a metal oxide active layer, and comprises a semiconductor portion, a conductor portion located on a left side of the semiconductor portion, and a conductor portion located on a right side of the semiconductor portion. The displaying substrate shown in FIG. 2 is applied to bottom-emission display panels.

Figure 5:
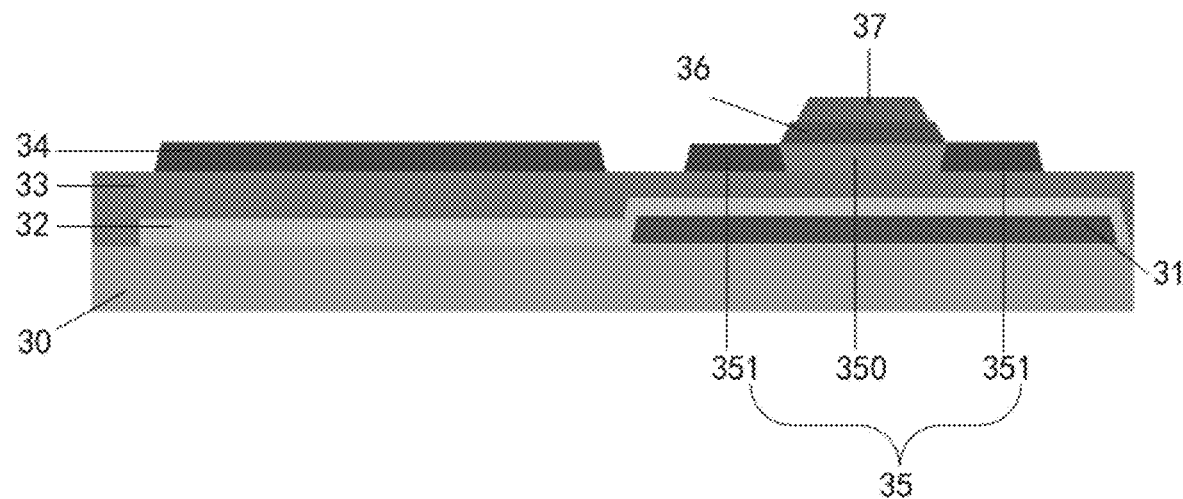
FIG. 5 is a structural diagram of another displaying substrate according to one embodiment of the disclosure.
Figure 6:
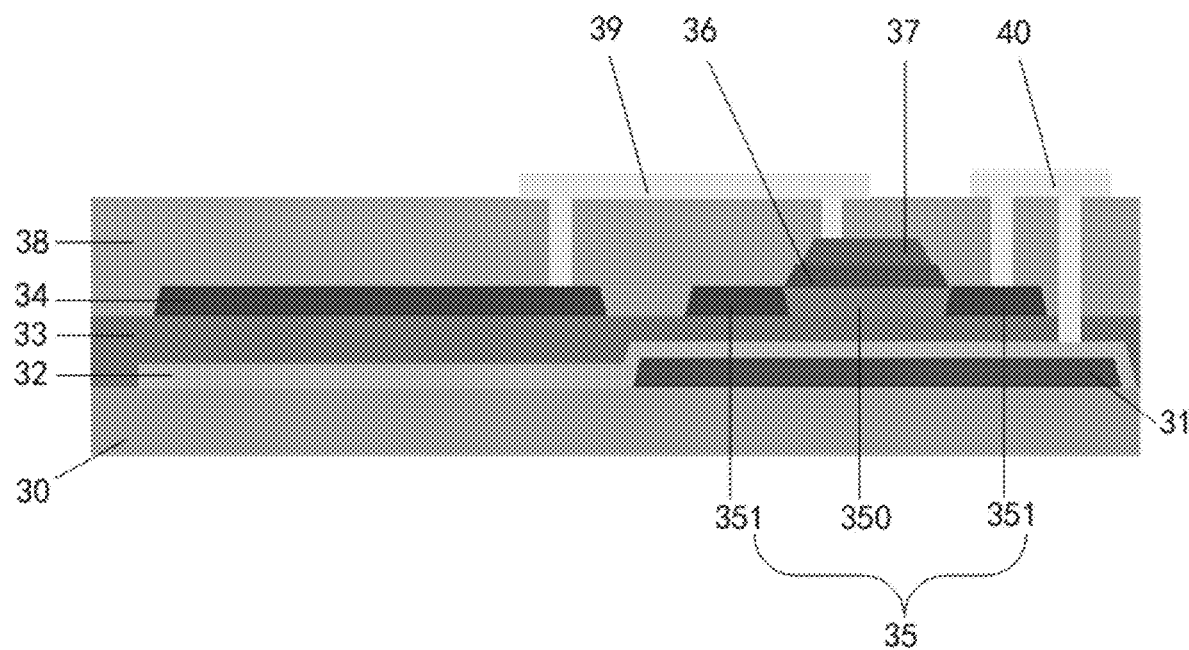
FIG. 6 is a structural diagram of another displaying substrate according to one embodiment of the disclosure.

The manufacturing method comprises:

S100: forming a substrate, wherein the substrate is made of a light-transmitting material such as glass;

S101: forming a light shield on the substrate, wherein the light shield is located in a non-luminous zone;

S102: forming a first capacitor electrode on the substrate, wherein the first capacitor electrode covers the light shield and is located in luminous zones and the non-luminous zone;

S103: forming a buffer layer, wherein the buffer layer covers the first capacitor electrode and the light shield and is located in the luminous zones and the non-luminous zone;

S104: forming a second capacitor electrode to be subjected to conductor transformation and an active layer to be subjected to conductor transformation, that do not overlap with each other, on the buffer layer by a one-step patterning process, wherein the active layer to be subjected to conductor transformation comprises a semiconductor portion, and portions to be subjected to conductor transformation located on two sides of the semiconductor portion and connected to the semiconductor portion, and a projection of the active layer on the substrate is located within a projection of the light shield on the substrate;

S105: forming a gate insulating film on the active layer;

S106: forming a gate metal film on the gate insulating film;

S107: coating the gate metal film with a photoresist;

S108: exposing, developing and etching the gate insulating film and the gate metal film with the same mask;

S109: performing conductor transformation on the second capacitor electrode to be subjected to conductor transformation and the portions to be subjected to conductor transformation;

S110: stripping the photoresist on the gate to form the displaying substrate in FIG. 5;

S111: forming an interlayer dielectric layer, wherein the interlayer dielectric layer is located in the luminous zones and the non-luminous zone and covers the second capacitor electrode, the gate and the active layer;

S112: forming a first via hole penetrating through the interlayer dielectric layer and the buffer layer, as well as a second via hole, a fourth via hole and the fifth via hole penetrating through the interlayer dielectric layer;

S113: forming a first connecting electrode, a second connecting electrode, a source and a drain that do not overlap with each other by a one-step patterning process, wherein the source and the drain are located in the non-luminous zone and are electrically connected to the active layer; the first connecting electrode is electrically connected to the first capacitor electrode by means of the first via hole and is electrically connected to the active layer by means of the second via hole, the second connecting electrode is electrically connected to the gate by means of the fourth via hole and is electrically connected to the second capacitor electrode by means of the fifth via hole, such that the displaying substrate in FIG. 6 is formed, and the source and the drain are not shown in FIG. 6;

S114: forming an insulating layer, wherein the insulating layer is located in the luminous zones and the non-luminous zone and covers the interlayer dielectric layer, the first connecting electrode, the second connecting electrode, the source and the drain;

S115: forming a third via hole penetrating through the insulating layer; and

S116: forming an anode on the insulating layer, wherein the anode is located in the luminous zones and the non-luminous zone and is electrically connected to the first connecting electrode by means of the third via hole, such that the displaying substrate shown in FIG. 2 is formed.

Figure 7:
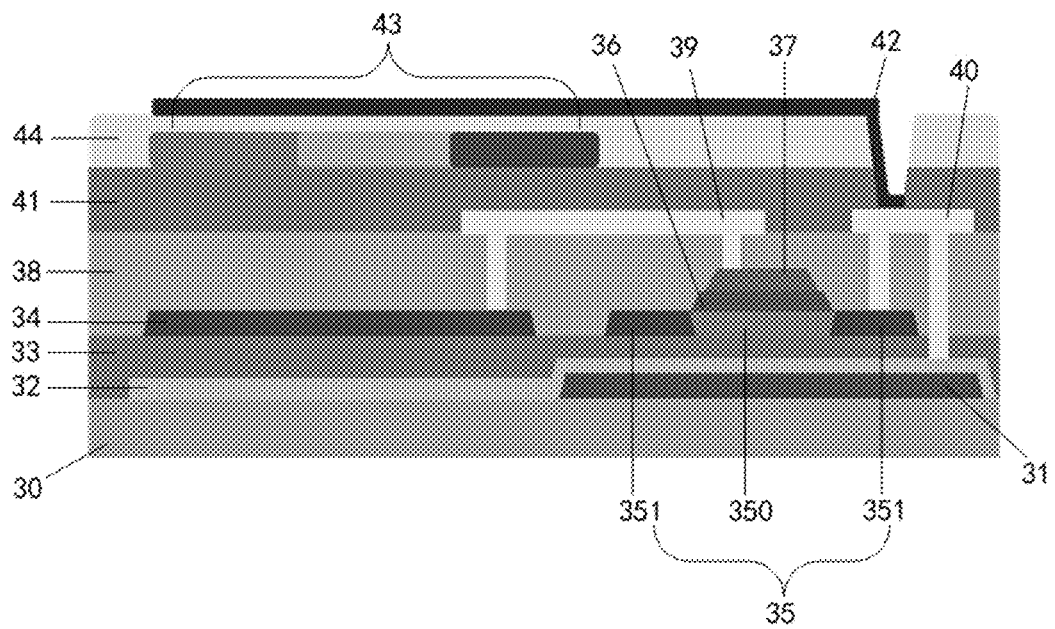
FIG. 7 is a structural diagram of another displaying substrate according to one embodiment of the disclosure.

It should be noted that if OLED units of the displaying substrate are of a WOLED structure (that is, light emitted by each OLED unit is white), after S114: forming an insulating layer and before S116: forming an anode on the insulating layer, the manufacturing method further comprises:

S117: sequentially forming a color film layer (marked as 43 in FIG. 7) and a resin insulating layer (Resin layer marked as 44 in FIG. 7) covering the color film layer on the insulating layer, wherein the white light emitted by the OLED units passes through the color film layer to be converted into color light such as red light, green light or blue light, and the anode is electrically connected to the first connecting electrode by means of a via hole penetrating through the resin insulating layer and the insulating layer, such that the displaying substrate shown in FIG. 7 is formed.

The structure, material and other relevant contents of the film layers involved in this embodiment of the disclosure may be understood with reference to the above embodiment, and will no longer be detailed here.

"One embodiment", "an embodiment" or "one or more embodiments" in this specification means that specific features, structures, or characteristics described in conjunction with said embodiment are included in at least one embodiment of the disclosure. In addition, it should be noted that the expression "in one embodiment" does not definitely refer to the same embodiment.

A great plenty of specific details are provided in this specification. However, it can be understood that the embodiments of the disclosure can be implemented even without these specific details. In some embodiments, known methods, structures and techniques are not stated in detail to ensure that the understanding of this specification will not be obscured.

In the claims, any reference marks should not be construed as limitations of the claims. The term "comprise" shall not exclude the existence of elements or steps not listed in the claims. "A/an" or "one" before an element shall not exclude the possibility of multiple said elements. The application may be implemented by means of hardware comprising a plurality of different elements and a properly programmed computer. In a claim in which a plurality of devices are listed, several of these devices may be specifically implemented by means of the same hardware. Terms such as "first", "second" and "third" do not indicate any order, and may be interpreted as names.

The above description merely illustrates specific implementations of the disclosure, and is not intended to limit the protection scope of the disclosure. All variations or substitutions easily obtained by any skilled in the art within the technical scope of the disclosure should fall within the protection scope of the disclosure. Thus, the protection scope of the disclosure should be subject to the protection scope of the claims.

The invention claimed is:

1. A displaying substrate, comprising an active area, wherein the active area comprises a plurality of luminous zones arranged in an array and a non-luminous zone located between the adjacent luminous zones;
the displaying substrate further comprising:
a first capacitor electrode at least partially located in the luminous zones;
a buffer layer covering the first capacitor electrode and located in the luminous zones and the non-luminous zone; and
a second capacitor electrode and an active layer that are disposed on the buffer layer and do not overlap with each other, the active layer being located in the non-luminous zone;
wherein, the first capacitor electrode, the buffer layer and the second capacitor electrode form a storage capacitor;
wherein the displaying substrate further comprises:
a gate disposed on and insulated from the active layer, located in the non-luminous zone, and electrically connected to the second capacitor electrode; and
an anode disposed on the second capacitor electrode and the gate, insulated from the second capacitor electrode and the gate, at least partially located in the luminous zones, and electrically connected to the first capacitor electrode and the active layer.

2. The displaying substrate according to claim 1, wherein the first capacitor electrode is located in the non-luminous zone, the second capacitor electrode is located in the luminous zones, the anode is located in the non-luminous zone, and the active layer is made of a metal oxide;
the displaying substrate further comprises:
an interlayer dielectric layer disposed between the second capacitor electrode and the anode, located in the luminous zones and the non-luminous zone, and covering the second capacitor electrode, the gate and the active layer.

3. The displaying substrate according to claim 2, further comprising:
a first connecting electrode and a second connecting electrode that are disposed between the interlayer dielectric layer and the anode and do not overlap with each other, wherein the first capacitor electrode, the active layer and the anode are electrically connected by the first connecting electrode, and the second capacitor electrode and the gate are electrically connected by the second connecting electrode.

4. The displaying substrate according to claim 3, wherein the second connecting electrode is located in the luminous zones and the non-luminous zone;
the displaying substrate further comprises:
a fourth via hole penetrating through the interlayer dielectric layer, wherein the second connecting electrode is electrically connected to the gate by the fourth via hole; and
a fifth via hole penetrating through the interlayer dielectric layer, wherein the second connecting electrode is electrically connected to the second capacitor electrode by the fifth via hole.

5. The displaying substrate according to claim 4, wherein the fourth via hole is formed above a side, close to the second connecting electrode, of the gate, and the fifth via hole is formed above a side, close to the second connecting electrode, of the second capacitor electrode.

6. The displaying substrate according to claim 3, further comprising:
a source and a drain disposed between the interlayer dielectric layer and the anode, wherein the source, the drain, the first connecting electrode and the second connecting electrode are disposed on a same layer and do not overlap with each other, and the source and the drain are located in the non-luminous zone and are electrically connected to the active layer.

7. The displaying substrate according to claim 2, wherein a thickness of a portion, forming the storage capacitor, of the buffer layer is less than a thickness of a portion, covering the storage capacitor, of the interlayer dielectric layer.

8. The displaying substrate according to claim 3, wherein the first connecting electrode is at least partially located in the non-luminous zone;
the displaying substrate further comprises:
an insulating layer disposed between the anode and the interlayer dielectric layer, located in the luminous zones and the non-luminous zone, and at least covering the interlayer dielectric layer, the first connecting electrode and the second connecting electrode.

9. The displaying substrate according to claim 8, further comprising:
a first via hole penetrating through the interlayer dielectric layer and the buffer layer, wherein the first connecting electrode is electrically connected to the first capacitor electrode by the first via hole;
a second via hole penetrating through the interlayer dielectric layer, wherein the first connecting electrode is electrically connected to the active layer by the second via hole; and
a third via hole penetrating through the insulating layer, wherein the first connecting electrode is electrically connected to the anode by the third via hole.

10. The displaying substrate according to claim 1, wherein the first capacitor electrode is located in the non-luminous zone;
the displaying substrate further comprises:
a substrate; and
a light-shield layer disposed between the substrate and the first capacitor electrode and located in the non-luminous zone, wherein a projection of the active layer on the substrate is located within a projection of the light-shield layer on the substrate, and the first capacitor electrode covers the light-shield layer.

11. A display panel, comprising the displaying substrate according to claim 1.

12. A manufacturing method of the displaying substrate according to claim 1, the displaying substrate comprising an active layer, the active layer comprising a plurality of luminous zones arranged in an array and a non-luminous zone located between the adjacent luminous zones;
the method comprising:
forming the first capacitor electrode, wherein the first capacitor electrode is at least partially located in the luminous zones;
forming the buffer layer, wherein the buffer layer covers the first capacitor electrode and is located in the luminous zones and the non-luminous zone; and
forming the second capacitor electrode and the active layer that do not overlap with each other on the buffer layer, wherein the active layer is located in the non-luminous zone;
wherein, the first capacitor electrode, the buffer layer and the second capacitor electrode form the storage capacitor.

13. The manufacturing method according to claim 12, further comprising:
forming a gate, wherein the gate is disposed on the active layer, located in the non-luminous zone, and is electrically connected to the second capacitor electrode; and
forming an anode, wherein the anode is disposed on the second capacitor electrode and the gate, at least partially located in the luminous zones, and electrically connected to the first capacitor electrode and the active layer.

14. The manufacturing method according to claim 13, wherein the anode is located in the non-luminous zone, and the displaying substrate further comprises: a first connecting electrode, a second connecting electrode, a source and a drain that are located between the second capacitor electrode and the anode and do not overlap with each other;
after the step of forming the gate and before the step of forming the anode, the method further comprises:
forming the first connecting electrode, the second connecting electrode, the source and the drain that do not overlap with each other by a one-step patterning process.

15. The manufacturing method according to claim 14, wherein the displaying substrate further comprises: an interlayer dielectric layer located between the second capacitor electrode and the anode;
after the step of forming the gate and before the step of forming the first connecting electrode and the second connecting electrode, the method further comprises:
forming the interlayer dielectric layer, wherein the interlayer dielectric layer is located in the luminous zones and the non-luminous zone and covers the second capacitor electrode, the gate and the active layer; and
forming a first via hole penetrating through the interlayer dielectric layer and the buffer layer, as well as a second via hole, a fourth via hole and a fifth via hole penetrating through the interlayer dielectric layer;
wherein, the first connecting electrode is electrically connected to the first capacitor electrode by the first via hole and is electrically connected to the active layer by the second via hole, and the second connecting electrode is electrically connected to the gate by the fourth via hole and is electrically connected to the second capacitor electrode by the fifth via hole.

16. The manufacturing method according to claim 13, wherein the second capacitor electrode is located in the luminous zones, and the active layer is made of a metal oxide;
forming a second capacitor electrode and an active layer that do not overlap with each other on the buffer layer comprises:
forming the second capacitor electrode to be subjected to conductor transformation and an active layer to be subjected to conductor transformation, that do not overlap with each other, on the buffer layer by a one-step patterning process, wherein the active layer to be subjected to conductor transformation comprises a semiconductor portion, and portions to be subjected to conductor transformation located on two sides of the semiconductor portion and connected to the semiconductor portion; and
performing conductor transformation on the second capacitor electrode to be subjected to conductor transformation and the portions to be subjected to conductor transformation to form the second capacitor electrode and the active layer.

17. The manufacturing method according to claim 16, wherein the displaying substrate further comprises a gate insulating layer located between the active layer and the gate;
before the step of forming the gate, the method further comprises:
forming the gate insulating layer, wherein the gate insulating layer is located on the active layer;
forming the gate insulating layer comprises:
forming a gate insulating film.

18. The manufacturing method according to claim 17, wherein forming the gate comprises: forming a gate metal film on the gate insulating film;
coating the gate metal film with a photoresist; and
exposing, developing and etching the gate insulating film and the gate metal film with a same mask to form the gate insulating layer and the gate.

19. The manufacturing method according to claim 18, wherein,
after the step of exposing, developing and etching the gate insulating film and the gate metal film with a same mask, the step of performing conductor transformation on the second capacitor electrode to be subjected to conductor transformation and the portions to be subjected to conductor transformation to is executed;
forming the gate further comprises:
stripping the photoresist on the gate after performing conductor transformation on the second capacitor electrode to be subjected to conductor transformation and the portions to be subjected to conductor transformation.

* * * * *